United States Patent
Chatterjee et al.

(10) Patent No.: US 10,468,093 B2
(45) Date of Patent: Nov. 5, 2019

(54) SYSTEMS AND METHODS FOR DYNAMIC RANDOM ACCESS MEMORY (DRAM) SUB-CHANNELS

(71) Applicant: NVIDIA Corporation, Santa Clara, CA (US)

(72) Inventors: Niladrish Chatterjee, Austin, TX (US); James Michael O'Connor, Austin, TX (US); Daniel Robert Johnson, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 61 days.

(21) Appl. No.: 15/448,416

(22) Filed: Mar. 2, 2017

(65) Prior Publication Data

US 2017/0255552 A1 Sep. 7, 2017

Related U.S. Application Data

(60) Provisional application No. 62/303,306, filed on Mar. 3, 2016.

(51) Int. Cl.
  *G06F 12/02* (2006.01)
  *G11C 11/4091* (2006.01)
  (Continued)

(52) U.S. Cl.
  CPC ...... *G11C 11/4091* (2013.01); *G06F 12/0215* (2013.01); *G11C 7/1012* (2013.01);
  (Continued)

(58) Field of Classification Search
  CPC ......... G06F 12/0646; G06F 2212/1041; G06F 2212/70; G11C 11/4091
  See application file for complete search history.

(56) References Cited

U.S. PATENT DOCUMENTS 6,938,142 B2 8/2005 Pawlowski
7,765,366 B2 7/2010 Akiyama et al.
(Continued)

OTHER PUBLICATIONS

Kim et al., "A Case for Exploiting Subarray-Level Parallelism (SALP) in DRAM," Proceedings of the International Symposium on Computer Architecture (ISCA), Jun. 2012, pp. 1-12.
(Continued)

*Primary Examiner* — Reginald G Bragdon
*Assistant Examiner* — Edward Wang
(74) *Attorney, Agent, or Firm* — Leydig, Voit & Mayer, Ltd.

(57) ABSTRACT

A method and system for a DRAM having a first bank that includes a first sub-array (SA) and a second SA. The first SA includes a first storage unit coupled to a first row-buffer in a first sub-channel (FSC) and a second storage unit in a second sub-channel (SSC). The second SA includes a third storage unit and a fourth storage unit coupled to a second row-buffer. The first SA is associated with a first row address (RA) and the FSC is associated with a first column address (CA) stored in the FSC. The second SA is associated with a second RA and the SSC is associated with a second CA stored in the SSC. The first and second CAs are used to select portions of data from the first and second row-buffers, respectively, for output to a data bus.

20 Claims, 12 Drawing Sheets

(51) Int. Cl.
*G11C 7/10* (2006.01)
*G11C 8/12* (2006.01)
*G11C 11/408* (2006.01)
*G11C 11/4093* (2006.01)
*G11C 11/4096* (2006.01)
*G06F 12/06* (2006.01)

(52) U.S. Cl.
CPC ............ *G11C 8/12* (2013.01); *G11C 11/4087* (2013.01); *G11C 11/4093* (2013.01); *G11C 11/4096* (2013.01); *G06F 12/0607* (2013.01); *G06F 2212/1028* (2013.01); *G06F 2212/1041* (2013.01); *Y02D 10/13* (2018.01)

(56) References Cited

U.S. PATENT DOCUMENTS

| | | | |
|---|---|---|---|
| 8,060,692 | B2 | 11/2011 | Christenson et al. |
| 9,361,955 | B2 | 6/2016 | Muralimanohar et al. |
| 9,405,698 | B2 | 8/2016 | Mazzola et al. |
| 9,449,659 | B2 | 9/2016 | Brewer et al. |
| 2001/0044875 | A1* | 11/2001 | Mailloux ............ G11C 7/1015 711/105 |
| 2012/0059983 | A1 | 3/2012 | Nellans et al. |
| 2015/0153966 | A1* | 6/2015 | Lee .................. G06F 13/4234 711/147 |

OTHER PUBLICATIONS

Ha et al., "Improving Energy Efficiency of DRAM by Exploiting Half Page Row Access," Proceedings of the International Symposium on Microarchitecture, 2016, pp. 1-12.

Shilov, A., "JEDEC Publishes HBM2 Specification as Samsung Begins Mass Production of Chips," AnandTech, from http://www.anandtech.com/show/9969/jedecpublisheshbm2specification, Jan. 20, 2016, pp. 1-18.

UDIPI et al., "Rethinking DRAM Design and Organization for Energy-Constrained Multi-Cores," of the International Symposium on Computer Architecture (ISCA), Jun. 2010, pp. 1-12.

Cooper-Balis et al., "Fine-Grained Activation for Power Reduction in DRAM," IEEE Micro, vol. 30, No. 3, May/Jun. 2010, pp. 34-47.

Zheng et al., "Mini-Rank: Adaptive DRAM Architecture for Improving Memory Power Efficiency," Proceedings of the International Symposium on Microarchitecture (MICRO), Nov. 2008, pp. 210-221.

Ahn et al., "Future Scaling of Processor-Memory Interfaces," Proceedings of the International Conference on High Performance Computing, Networking, Storage and Analysis, Nov. 2009, pp. 1-12.

Ahn et al., "Improving System Energy Efficiency with Memory Rank Subsetting," ACM Transactions on Architecture and Code Optimization, vol. 9, No. 1, Mar. 2012, pp. 4:1-4:28.

Ahn et al., "Multicore DIMM: an Energy Efficient Memory Module with Independently Controlled DRAMs," IEEE Computer Architecture Letters, vol. 7, No. 1, 2008, pp. 1-4.

Rambus, "Module Threading," from https://www.rambus.com/module-threading/?nabe=4857318206603264:1&utm_referrer=https%3A%2F%2Fwww.google.com%2F, 2017, pp. 1-4.

Herrero et al., "Thread Row Buffers: Improving Memory Performance Isolation and Throughput in Multiprogrammed Environments," IEEE Transactions on Computers, vol. 62, No. 9, Sep. 2013, pp. 1879-1892.

Zhang et al., "Half-DRAM: a High-bandwidth and Low-power DRAM Architecture from the Rethinking of Fine-grained Activation," Proceedings of the International Symposium on Computer Architecture (ISCA), Jun. 2014, pp. 1-12.

Chatterjee et al., "Architecting an Energy-Efficient DRAM System for GPUs," 2017 IEEE International Symposium, Preprint, retrieved from https://ieeexplore.ieee.org/abstract/document/7920815/citations, May 2017, 12 pages.

O'Connor et al., "Fine-Grained DRAM: Energy-Efficient DRAM for Extreme Bandwidth Systems," IEEE Proceeding, Micro-50, 2017 Proceedings of the 50th Annual IEEE/ACM International Symposium on Microarchitecture, Oct. 14-18, 2017, pp. 41-54.

Son et al., "Microbank: Architecting Through-Silicon Interposer-Based Main Memory Systems," SC14: International Conference for High Performance Computing, Networking, Storage and Analysis, Nov. 16-21, 2014, Preprint, retrieved from https://ieeexplore.ieee.org/document/7013073/, 12 pages.

\* cited by examiner

| Cycle | Row Command | Row Address | Row Sub-channel Mask | Column Command | Column Address | Column Sub-channel Mask |
|---|---|---|---|---|---|---|
| 0 | Activate | 15 | 00101000 | | | |
| 1 | Activate | 1042 | 01000000 | | | |
| 2 | Activate | 2100 | 10000000 | | | |
| 3 | Activate | 555 | 00000001 | | | |
| 4 | Activate | 5001 | 00010000 | | | |
| 5 | Activate | 1777 | 00000010 | Read | 3 | 00101000 |
| 6 | Activate | 2910 | 00010000 | Read | 5 | 01000000 |
| 7 | | | | Read | 0 | 10000000 |
| 8 | | | | Read | 2 | 00000001 |
| 9 | | | | Read | 5 | 00010000 |
| 10 | | | | Read | 2 | 00000010 |
| 11 | | | | Read | 4 | 00010000 |
| 12 | | | | | | |
| 13 | | | | Read | 2 | 00001000 |
| 14 | | | | Read | 3 | 01000000 |
| 15 | | | | Write | 6 | 00100000 |
| 16 | | | | Read | 1 | 10000000 |
| 17 | | | | Read | 7 | 00010001 |
| 18 | | | | Read | 3 | 00000010 |
| 19 | | | | | | |
| 20 | | | | | | |
| 21 | Precharge | | 00000100 | | | |
| 22 | | | | Read | 1 | 01000000 |
| 23 | Precharge | | 00001000 | Write | 7 | 00100000 |
| 24 | Activate | 2911 | 00000100 | | | |
| 25 | | | | Read | 6 | 00010000 |
| 26 | Activate | 6100 | 00001000 | Read | 4 | 00000010 |
| 27 | Precharge | | 10000000 | | | |
| 28 | | | | | | |
| 29 | | | | Write | 0 | 00000101 |
| 30 | Activate | 2101 | 10000000 | Read | 3 | 01000000 |
| 31 | | | | | | |
| 32 | | | | | | |
| 33 | | | | Read | 4 | 00011000 |
| 34 | | | | | | |
| 35 | | | | Read | 4 | 10000000 |
| 36 | Precharge | | 00100010 | | | |
| 37 | | | | | | |
| 38 | | | | | | |
| 39 | | | | | | |
| 40 | | | | | | |
| 41 | | | | | | |
| 42 | | | | | | |
| 43 | | | | | | |
| 44 | | | | | | |

*Fig. 3A*

| Cycle | Sub-channel 7 | Sub-channel 6 | Sub-channel 5 | Sub-channel 4 |
|---|---|---|---|---|
| 0 |  |  | Activate Row 15 |  |
| 1 |  | Activate Row 2100 | Activate Row 15 |  |
| 2 | Activate Row 2100 | Activate Row 2100 |  |  |
| 3 | Activate Row 2100 | Activate Row 2100 |  |  |
| 4 | Activate Row 2100 | Activate Row 2100 | Read Col 3 | Activate Row 5001 |
| 5 | Activate Row 2100 | Read Col 5 | Read Col 3 | Activate Row 5001 |
| 6 | Activate Row 2100 | Read Col 5 |  | Activate Row 5001 |
| 7 | Read Col 0 | Read Col 5 |  | Activate Row 5001 |
| 8 | Read Col 0 |  |  | Activate Row 5001 |
| 9 |  |  |  | Read Col 5 |
| 10 |  |  |  | Read Col 5 |
| 11 |  |  |  |  |
| 12 |  |  |  |  |
| 13 |  | Read Col 3 |  |  |
| 14 |  | Read Col 3 |  |  |
| 15 |  | Read Col 3 | Write Col 6 |  |
| 16 | Read Col 1 | Read Col 3 | Write Col 6 |  |
| 17 |  |  |  | Read Col 7 |
| 18 |  |  |  | Read Col 7 |
| 19 |  |  |  |  |
| 20 |  |  |  |  |
| 21 |  |  |  |  |
| 22 |  | Read Col 1 |  |  |
| 23 |  | Read Col 1 | Write Col 7 |  |
| 24 |  |  |  |  |
| 25 |  |  |  | Read Col 6 |
| 26 |  |  |  |  |
| 27 | Precharge |  |  |  |
| 28 | Precharge |  |  |  |
| 29 | Precharge |  |  |  |
| 30 | Activate Row 2101 | Read Col 3 |  |  |
| 31 | Activate Row 2101 | Read Col 3 |  |  |
| 32 | Activate Row 2101 |  |  |  |
| 33 | Activate Row 2101 |  |  | Read Col 4 |
| 34 | Activate Row 2101 |  |  | Read Col 4 |
| 35 | Read Col 4 |  |  |  |
| 36 | Read Col 4 |  | Precharge |  |
| 37 |  |  | Precharge |  |
| 38 |  |  | Precharge |  |
| 39 |  |  | Precharge |  |
| 40 |  |  |  |  |
| 41 |  |  |  |  |
| 42 |  |  |  |  |
| 43 |  |  |  |  |
| 44 |  |  |  |  |

*Fig. 3B*

| Cycle | Sub-channel 3 | Sub-channel 2 | Sub-channel 1 | Sub-channel 0 |
|---|---|---|---|---|
| 0 | | | Activate Row 15 | |
| 1 | | Activate Row 2100 | | |
| 2 | Activate Row 2100 | | | |
| 3 | | | | |
| 4 | | | | Activate Row 5001 |
| 5 | | | Read Col 3 | |
| 6 | | Read Col 5 | | |
| 7 | Read Col 0 | | | |
| 8 | | | | |
| 9 | | | | Read Col 5 |
| 10 | | | | |
| 11 | | | | |
| 12 | | | | |
| 13 | | | | |
| 14 | | Read Col 3 | | |
| 15 | | | Write Col 6 | |
| 16 | Read Col 1 | | | |
| 17 | | | | Read Col 2 |
| 18 | | | | |
| 19 | | | | |
| 20 | | | | |
| 21 | | | | |
| 22 | | Read Col 1 | | |
| 23 | | | Write Col 7 | |
| 24 | | | | |
| 25 | | | | Read Col 6 |
| 26 | | | | |
| 27 | Precharge | | | |
| 28 | | | | |
| 29 | | | | |
| 30 | Activate Row 2101 | Read Col 3 | | |
| 31 | | | | |
| 32 | | | | |
| 33 | | | | Read Col 4 |
| 34 | | | | |
| 35 | Read Col 4 | | | |
| 36 | | | Precharge | |
| 37 | | | | |
| 38 | | | | |
| 39 | | | | |
| 40 | | | | |
| 41 | | | | |
| 42 | | | | |
| 43 | | | | |
| 44 | | | | |

SYSTEMS AND METHODS FOR DYNAMIC RANDOM ACCESS MEMORY (DRAM) SUB-CHANNELS

CLAIM OF PRIORITY

This application claims the benefit of U.S. Provisional Application No. 62/303,306 titled "Systems and Method for Fine-Grained Dynamic Random Access Memory (DRAM) Activations," filed Mar. 3, 2016, the entire contents of which is incorporated herein by reference.

FIELD OF THE INVENTION

The present invention relates to dynamic random access memory (DRAM), and more particularly to a DRAM sub-channels architecture.

BACKGROUND

Graphics Processing Units (GPUs) and other throughput processing architectures have scaled performance through simultaneous improvements in compute capability and aggregate memory bandwidth. To continue on this trajectory, future systems will soon require more than 1 TB/s of bandwidth. Satisfying this increasing bandwidth demand, without a significant increase in the power budget for the DRAM, is a key challenge. The off-package high-speed signaling across a printed circuit board (PCB) used by traditional bandwidth-optimized graphics double data rate type five (GDDR5) memories can consume a significant portion of the system energy budget, becoming prohibitive as bandwidths scale beyond 1 TB/s.

On-package stacked memories, such as High Bandwidth Memory (HBM), allow the processor and memory to communicate via short links within a package, thereby reducing the cost of data transfer on the interface between the DRAM stack and the processor die. While this improved signaling reduces the I/O energy (the energy on the link between the DRAM and processor dies), the energy required to move data from the DRAM bit cells to the input/output (I/O) interface of the DRAM device/stack remains unchanged. Consequently, as we project the bandwidth demands of future GPUs, further energy reductions within the DRAM itself are required to enable future high-bandwidth systems. Thus, there is a need for addressing these issues and/or other issues associated with the prior art.

SUMMARY

A method and system for DRAM with sub-channels is described. The DRAM comprises control logic for generating row addresses and column addresses as well as a first bank that are coupled to the control logic. The first bank comprises a first sub-array and a second sub-array. The first sub-array includes a first storage unit coupled to a first row-buffer in a first sub-channel and a second storage unit in a second sub-channel. The second sub-array includes a third storage unit in the first sub-channel and a fourth storage unit coupled to a second row-buffer in the second sub-channel. The first sub-array is associated with a first row address and the first sub-channel is associated with a first column address that is stored in the first sub-channel and used to select a first portion of data from the first row-buffer for output to a data bus. The second sub-array is associated with a second row address and the second sub-channel is associated with a second column address that is stored in the second sub-channel and used to select a second portion of data from the second row-buffer for output to the data bus.

BRIEF DESCRIPTION OF THE DRAWINGS

FIG. 3A illustrates a first portion of a table detailing per-cycle operations for one bank of the DRAM with sub-channels shown in FIG. 1A, in accordance with one embodiment;

FIG. 3B illustrates a second portion of a table detailing per-cycle operations for one bank of the DRAM with sub-channels shown in FIG. 1A, in accordance with one embodiment;

FIG. 3C illustrates a third portion of a table detailing per-cycle operations for one bank of the DRAM with sub-channels shown in FIG. 1A, in accordance with one embodiment;

DETAILED DESCRIPTION

A DRAM sub-channel architecture with improved energy efficiency is described. A DRAM bank is a two-dimensional (2D) storage unit, where each row in the 2D array is as wide as 2 KB in modern dense GDDR5 and HBM devices. A single DRAM atom is accessed from exactly one of the DRAM banks on a DRAM channel. In the context of the following description, a DRAM atom is the smallest (indivisible) request size that is allowed for a read or write command. In one embodiment, a DRAM atom is a 32 byte request. To read a DRAM atom, an entire row has to be fetched from the 2D array and stored to a row-buffer using an activation command. The requested atom is then read from the row-buffer using a column-read command.

The hierarchical organization within a DRAM device is exploited to reduce the minimum row-activation granularity and the DRAM datapath is divided while avoiding significant increases in the die area. Narrow sub-channels are created within a single DRAM die or device. Consequently, a single DRAM request (e.g., activate, read, and/or write operation) is satisfied by a single sub-channel, at a lower energy cost than a conventional dense GDDR5 or HBM device. In addition, multiple sub-channels can be operated in parallel to return different access requests simultaneously. Thus, despite the smaller bandwidth available to transfer each access request, the overall bandwidth utilization is maintained at the same level as the conventional DRAMs when there are multiple outstanding access requests, as is the case in high throughput systems. When there is little locality in the access stream, such that the DRAM bandwidth is underutilized due to limitations on the rate of row activations, the sub-channel architecture can boost the delivered bandwidth by supporting a higher rate of smaller activation requests in a single DRAM device. In particular, particle-systems and graph analytics workloads may benefit from the higher rate of smaller activation requests provided by a DRAM with sub-channels.

Figure 1A:
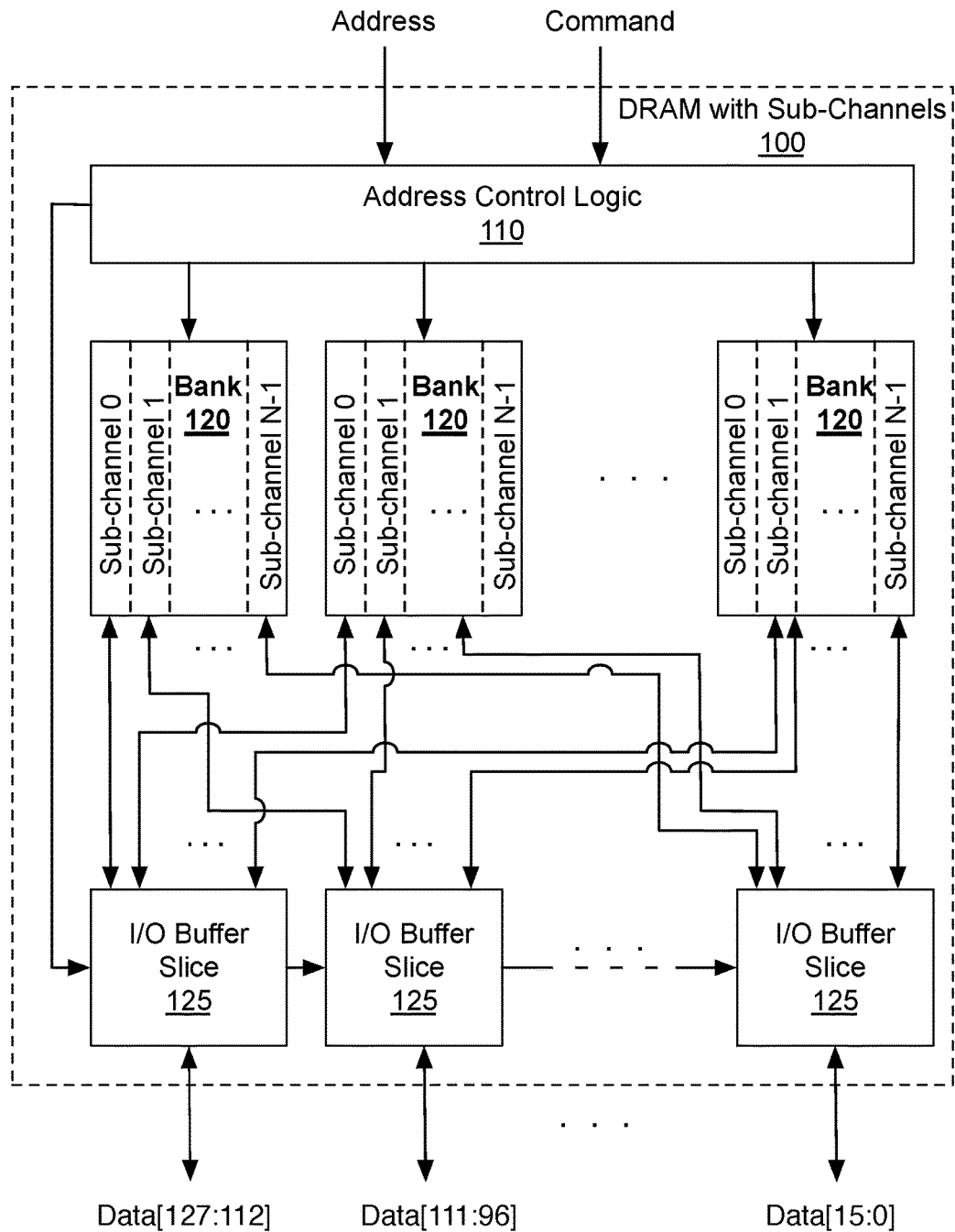
FIG. 1A illustrates a block diagram of a DRAM with sub-channels, in accordance with one embodiment.

FIG. 1A illustrates a block diagram of a DRAM with sub-channels 100, in accordance with one embodiment. The DRAM with sub-channels 100 is a collection of independent storage arrays called banks 120, where each bank 120 includes a dedicated row decoder and a column decoder. In contrast with conventional memory systems that partition multiple DRAM devices into multiple "channels", where each DRAM device is entirely included within one of the channels, the DRAM with sub-channels 100 partitions each bank within a single DRAM integrated circuit die into sub-channels. Address control logic 110 is coupled to a dedicated row decoder and column decoder within each of the banks 120. The data signals from the banks 120 are connected via a shared bus to an I/O buffer comprising multiple I/O buffer slices 125. In one embodiment, each bank is partitioned into N sub-channels and the number of I/O buffer slices 125 equals the number of sub-channels. In one embodiment, each I/O buffer slice 125 is the same size as a DRAM atom, the unit of a single memory transaction (32 B in HBM and GDDR5). In one embodiment, the data[127:0] signals coupled to the I/O buffer are connected to an external I/O interface using a DDR-style interconnect (128-bits wide in HBM). In stacked memories, the I/O buffer connects to the external interface through on-die wires, inter-die through-silicon vias (TSVs), and finally wires on the base-layer to the edge of the stack. The DRAM with sub-channels 100 may be included in a DRAM die with additional logic and/or circuitry, such as a memory controller and DDR interface circuitry. In one embodiment, the I/O buffer and the external DDR interface (TSVs, base-layer wires and pins) are also split into separate sections, each section dedicated to a sub-channel.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Memory Sub-Channels Architecture

In addition to the I/O energy used to transfer the data from a DRAM to a host processor, the energy for a DRAM access can be decomposed into two primary components, the row energy or the energy to precharge a bank and activate a row, and the column energy or the energy to access a subset of data from the activated row and transfer the subset of data to the I/O pins. The column energy of a DRAM access primarily depends on the distance over which the data is transferred over a datapath, the rate of switching on the datapath, and the capacitance of wires that implement the datapath.

The row energy is determined by the fixed activation and precharge energy required to activate a DRAM row, sense and latch data stored in the row into the row buffer, restore the bit cell values, and precharge the bit lines. The per-access component of row energy is the sum of activation and precharge energy averaged over the number of bits accessed within a row. As a result, the row energy is highly dependent on the spatial locality of the memory access stream. With higher spatial locality, the cost of opening a new row is amortized over a larger number of bit transfers. Row energy accounts for nearly half of DRAM energy on average in typical workloads, and the row energy can dominate DRAM energy for low-locality workloads. Low row locality can also cause performance problems, limiting utilization of DRAM bandwidth and leading to workloads limited by the DRAM row activation rate.

Often, for graphics applications, only a quarter of the row is utilized for an activate operation. Emerging graphics applications, such as ray tracing and particle systems, more closely resemble compute workloads in terms of row locality, having lower locality compared with traditional graphics applications. Since a row-activate operation is very energy-intensive, a direct consequence of the observed low spatial locality is high effective per-access row energy. The energy cost of activating the whole row is averaged over only the small number of bits that are read or written. Few accesses-per-activate can also reduce bandwidth utilization in memory intensive benchmarks.

The DRAM with sub-channels 100 addresses the problems of increased row-energy while also boosting the performance of many memory-intensive GPU applications. Importantly, the DRAM storage is partitioned in an area-efficient manner to reduce wasted activation energy and the datapath in the DRAM array and the periphery is segmented to enable parallel operations to continue to utilize the full bandwidth of the DRAM. In one embodiment, the DRAM with sub-channels 100 includes a data-burst reordering mechanism to reduce column energy. The DRAM with sub-channels 100 may reduce energy consumption by 35% over a baseline energy consumption for a conventional DRAM.

Figure 1B:
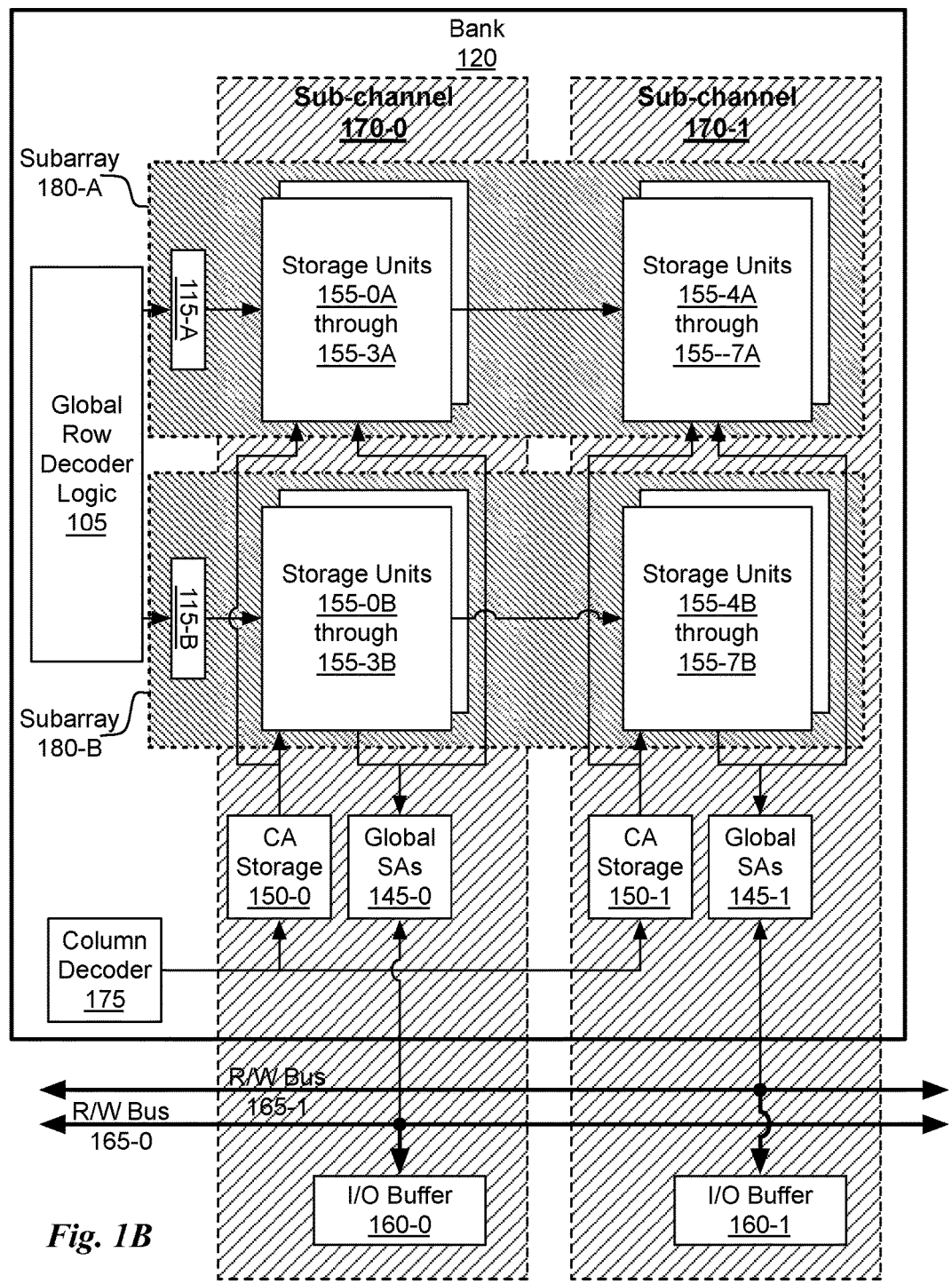
FIG. 1B illustrates a block diagram of a bank in the DRAM with sub-channels shown in FIG. 1A, in accordance with one embodiment.

FIG. 1B illustrates a block diagram of a bank 120 in the DRAM with sub-channels 100 shown in FIG. 1A, in accordance with one embodiment. The bank 120 includes a global row decoder logic 105, a column decoder 175, and at least one sub-channel 170. The bank 120 shown in FIG. 1B, includes two sub-channels, a sub-channel 170-0 and a sub-channel 170-1. In other embodiments, more than two sub-channels 170 are included in a bank 120.

Figure 1C:
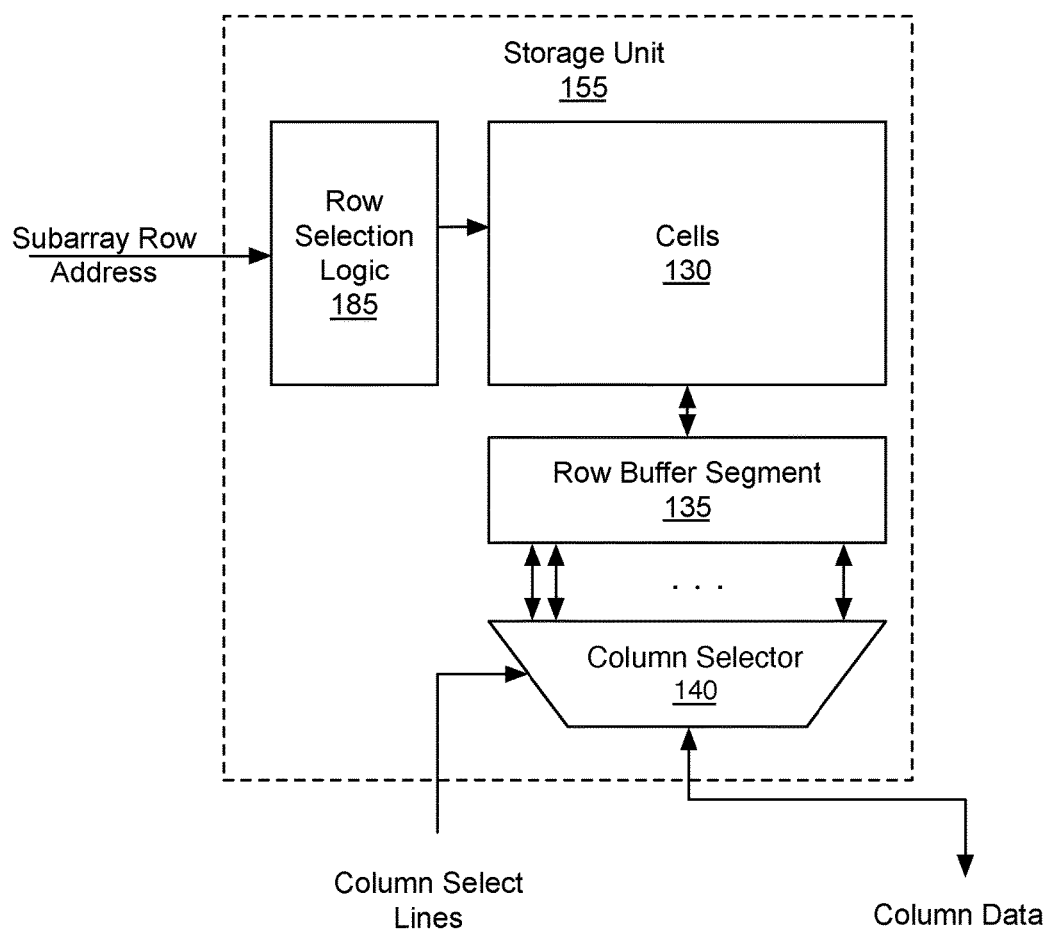
FIG. 1C illustrates a block diagram of a storage unit within the bank shown in FIG. 1B, in accordance with one embodiment.

Each bank 120 is organized as a two-dimensional (2D) array of storage units such as the storage units 155-0A through 155-3A, 155-4A through 155-7A, 155-0B through 155-3B, and 155-3B through 155-7A. Details of the storage unit 155 are shown in FIG. 1C. In the context of the following description, a sub-channel 180 may include T storage units 155, where T is an integer value greater or equal to 1. As shown in FIG. 1B, the sub-channel 170-0 includes the four storage units 155-0A through 155-3A and the four storage units 155-0B through 155-3B. In one embodiment, the four storage units 155 within each of the storage units 155-0A through 155-3A and the storage units 155-0B through 155-3B are aligned horizontally and share a CA (column address) storage 150-0 and global SAs (sense amplifiers) 145-0. In other embodiments, more or less than four storage units 155 may be included in each of the storage units 155-0A through 155-3A and 155-0B through 155-3B. Similarly, the sub-channel 170-1 includes the storage units 155-4A through 155-7A and storage units 155-4B through 155-7B. In one embodiment, the four storage units 155 within each of the storage units 155-4A through 155-7A and the storage units 155-3B through 155-7B may each include four storage units 155 that are aligned horizontally and share a CA storage 150-1 and global SAs 145-1. In other embodiments, more or less than four storage units 155 may be included in each of the storage units 155-4A through 155-7A and 155-4B through 155-7B.

In one embodiment, a group of storage units 155 organized in the horizontal direction is called a subarray 180. For example, the subarray 180-A includes a subarray row address logic 115-A, the storage units 155-0A through 155-3A, 155-4A through 155-7A and the subarray 180-B includes a subarray row address logic 115-B, the storage units 155-0B through 155-3B and 155-4B through 155-7B. In the context of the following description, a subarray 180 may include S storage units 155, where S is an integer value greater than or equal to 2.

The global row decoder logic 105 receives a row address from the address control logic 110, at least partially decodes the row address and provides a subarray row address to each of the subarrays 180. In one embodiment, the global row decoder logic 105 outputs at least a row selection signal for each row in the bank 120. The column decoder 175 receives a column address from the address control logic 110, partially decodes the column address and sends a sub-channel column address to each one of the sub-channels 170.

In addition to the storage units 155, each sub-channel 170 also includes the column CA storage 150, Global SAs 145, and an I/O buffer 160. The CA storage 150 stores the sub-channel column address and decodes the sub-channel column address to drive column select lines for the storage units 155 in the sub-channel 170. The CA storage 150 is described in more detail in conjunction with FIG. 2D. In one embodiment, the global SAs 145 include sense amplifiers coupled to the bit lines of the storage units 155. The global SAs 145 may also include latches to store data read from or written to one row of the storage units 155. For example, when 4 storage units 155 are included in storage units 155-0A through 155-3A and 155-0B through 155-3B that are coupled to the global SAs 145-0, each one of the storage units 155 in either the subarray 180-A or 180-B may provide 8 bits (1 byte) of data for a row and the global SAs 145-0 stores the 4 bytes of data. In another embodiment, the global SAs 145 include a storage circuit (e.g., latches, flip-flops, etc.) and the necessary sensing/amplification occurs in the local sense-amps within the storage units 155. In some embodiments, the global SAs 145 are omitted and the data is transferred directly to the I/O buffers 160.

The I/O buffer 160-0 is included in the sub-channel 170-0 and the I/O buffer 160-1 is included in the sub-channel 170-1. The I/O buffer 160-0 is coupled to the storage units 155-0A through 155-3A and the storage units 155-0B through 155-3B through the global sense amplifiers 145-0. The I/O buffer 160-1 is coupled to the storage units 155-4A through 155-7A and the storage units 155-3B through 155-7B through the global sense amplifiers 145-1. A R/W bus 165-0 is coupled to the I/O buffer 160-0 in the sub-channel 170-0 in each of the banks 120. A R/W bus 165-1 is coupled to the I/O buffer 160-1 in the sub-channel 170-1 in each of the banks 120.

When the global SAs 145 store 4 bytes of data, each one of the I/O buffers 160 stores 4 bytes multiplied by N, where N is the number of subchannels 170 and each one of the R/W buses 165 transmits 4 bytes multiplied by N. In one embodiment, the I/O buffers 160 are configured to support a single-data rate on the R/W busses 165 and a double-data rate at the DRAM with sub-channels 100 external interface. For example, each one of the R/W busses 165 may transmit 32 bits each internal clock cycle and the I/O buffers 160 may drive or receive 16 bits at the external interface for each internal clock cycle. Each one of the I/O buffers 160 for a sub-channel 170 is included in the dedicated I/O buffer slice 125 (shown in FIG. 1A) for the sub-channel 170. In other words, the I/O buffer slice 125 for the sub-channel 170-0 includes the I/O buffers 160-0 for the sub-channel 170-0 in each of the banks 120 and is therefore shared by each of the banks 120. Control logic that is coupled to the I/O buffers 160 to control whether the I/O buffers 160 read from or write to the R/W bus 165 and whether the global SAs 145 drive the R/W bus 165, go to a high-impedance, or read the R/W bus 165 is not shown in FIG. 1B.

FIG. 1C illustrates a block diagram of a storage unit 155 within the bank 120 shown in FIG. 1B, in accordance with one embodiment. In one embodiment, each storage unit 155 includes a 512×512 array of DRAM cells 130 and a 512-bit sense-amplifier and latch, referred to hereinafter as a row-buffer segment 135. When a subarray 180 includes 32 storage units 155, and each of the 32 storage units 155 includes a 512 bit row-buffer segment 135, a 2 KB row-buffer is provided by the 32 storage units 155 within one subarray 180. The 2 KB row-buffer is physically distributed between the 32 storage units 155, and a DRAM atom is spread out over the entire subarray 180, with each storage unit 155 contributing 8 bits to each 32 B atom (64 atoms are included in the 2 KB row-buffer). In one embodiment, the row buffer segment 135 in one storage unit 155 in a first subarray 180 is shared with at least one other storage unit 155 in a second subarray 180, where both storage units 155 are in the same sub-channel 170. When the row buffer segments 135 are shared, the column selectors 140 may also be shared.

The storage unit 155 also includes row selection logic 185 and a column selector 140. The column selector 140 receives column select lines that are provided by the CA storage 150. The row selection logic 185 receives a subarray row address that is generated by the subarray row address logic 115. When at least a portion of a row within the storage unit 155 is accessed, data read from or written to the cells 130 is stored in the row buffer segment 135. For a read access, the column selector 140 selects, based on the column select lines, at least a portion of the data stored in the row buffer segment 135 as the column data that is output to the global sense amplifiers 145. When at least a portion of a row within the storage unit 155 is written, the column data is received from the global sense amplifiers 145 and stored in the row buffer segment 135 based on the column select lines before being written into the cells 130.

The subarray 180-A is associated with a first row address and the subarray 180-B is associated with a second row address. The sub-channel 170-0 is associated with a first column address that is stored in the CA storage 150-0 and is used to select a first portion of data from the row-buffer segments 135 within the storage units 155-0A through 155-3A or 155-0B through 155-3B for output to the R/W bus 165-0. The sub-channel 170-1 is associated with a second column address that is stored in the CA storage 150-1 and used to select a second portion of data from the row-buffer segments 135 within the storage units 155-3A through 155-7A or 155-3B through 155-7B for output to the R/W bus 165-1.

Segmented Activation

To reduce DRAM row energy, the row-activation granularity (i.e., the number of bits accessed by an activate command) is reduced. A technique called Master Wordline Segmentation achieves a reduction in activation granularity without significant increases in die area by leveraging the hierarchical structure of the DRAM wordline to turn on only part of a row. A row-activation signal is hierarchical by design since a Master Wordline (MWL) drives a Local Wordline (LWL) in each storage unit 155, and each LWL turns on the access transistors of a row of cells in a storage unit 155. In one embodiment each MWL is one of the row selection signals generated by the global row decoder logic 105.

Figure 2A:
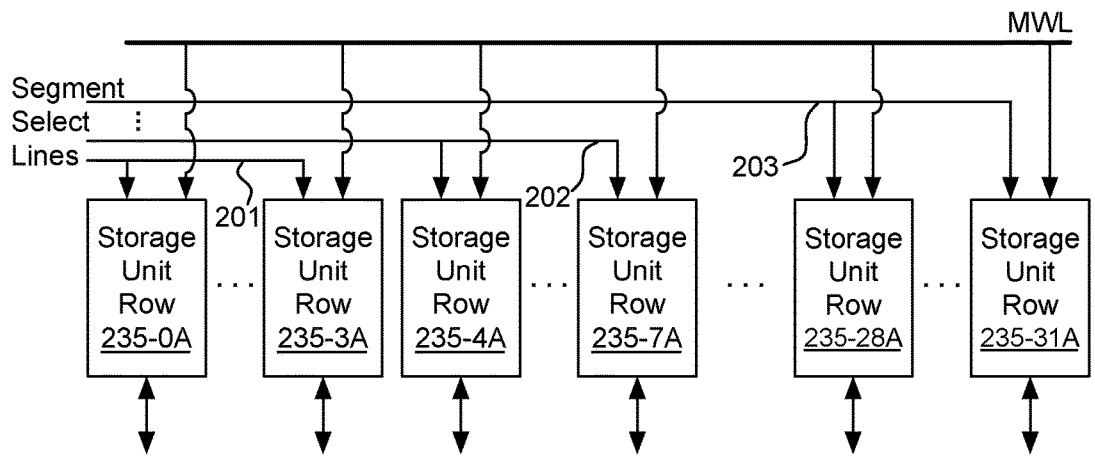
FIG. 2A illustrates a block diagram of selective activation for sub-channels, in accordance with one embodiment.

FIG. 2A illustrates a block diagram of selective activation for sub-channels, in accordance with one embodiment. A single subarray 180 including a single row within 32 storage units 155 is shown in FIG. 2A. In conventional DRAMs, in response to an activation command, the MWL is asserted, which in turn drives a LWL in each of the storage units 155 by activating the corresponding local-wordline driver (LWD) in each one of the storage units 155; thus, all the storage units 155 in the subarray 180 are activated in unison to fetch an entire row from storage units row 235. To prevent all of the storage cells in the row from being activated, the per-row MWL is effectively segmented by segment select lines to drive a subset of the LWLs in the row that corresponds to a subset of the storage units 155. In one embodiment, the segment select signals that drive the segment select lines, such as segment select lines 201, 202, and 203, are provided by the global row decoder logic 105 and may be provided to each storage unit 155 along with the subarray row address. A set of segment select lines may be shared by all of the storage units 155 in a subarray. In one embodiment, segment selection is encoded with a command and segment select decoder logic (that may be included in either the global row decoder logic 105 or the address control logic 110, or implemented separately) decodes the segment selection to generate the segment select signals. In another embodiment, the segment selection mask is encoded as a field in the command and used directly as the segment select signals.

FIG. 2A shows a MWL that has been divided into 8 segments, where each segment is associated with one of the segment select lines. Even though the entire MWL is driven, the corresponding LWLs may be activated only in storage units row 235-1A through 135-3A, storage units row 235-4A through 235-7A, . . . or storage units row 235-28A through 235-31A, thereby incurring only an eighth of the row energy. The number of segment select lines may be increased to increase the number of segments in a row or decreased to reduce the number of segments in a row.

Figure 2B:
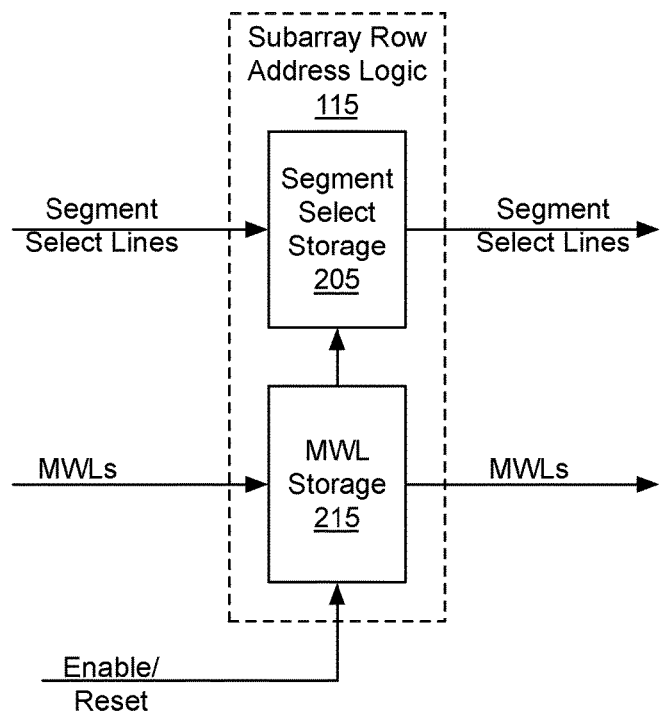
FIG. 2B illustrates a block diagram of the subarray row address logic shown in FIG. 1B, in accordance with one embodiment.

FIG. 2B illustrates a block diagram of the subarray row address logic 115 shown in FIG. 1B, in accordance with one embodiment. The subarray row address logic 115 receives an MWL signal for each row within a subarray 180. The subarray row address logic 115 also receives the segment select lines for the row that is activated by one of the MWL signals. The segment select storage 205 and MWL storage 215 may be implemented as latches, registers, or other suitable storage circuits. The segment select storage 205 and MWL storage 215 are enabled after each activate command to a given subarray 180, and reset after the corresponding sub-channel 170 and subarray 180 has been precharged.

In one embodiment, the global row decoder logic 105 partially decodes the row address, producing in one MWL for each set of rows (e.g. 4 rows). In this case, in addition to the MWL sent to each subarray 180, the remaining (i.e., undecoded) address bits are transmitted (either as is or separately decoded) to each storage unit 155, where the remaining bits are combined with the MWL and the segment select signals to enable the per-row local wordline driver (LWD) to drive the local wordline (LWL) in a given array of cells 130.

Figure 2C:
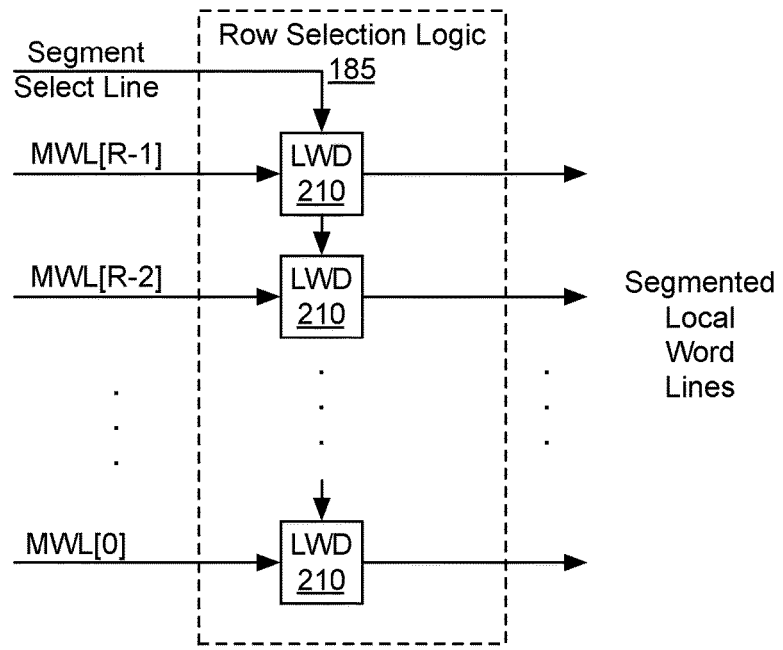
FIG. 2C illustrates a block diagram of row selection logic shown in FIG. 1C, in accordance with one embodiment.

FIG. 2C illustrates a block diagram of row selection logic 185 from FIG. 1C, in accordance with one embodiment. The activated storage units 155 are selected using the segment select signals that enable or disable the LWD stripe within a row of the DRAM cells 130. In the DRAM with sub-channels 100, the enable signals for each group of storage units 155 that are simultaneously activated are driven by a unique segment select signal. Thus no changes are required to the layout of the DRAM cells 130. The row selection logic 185 includes a local wordline driver (LWD) 210 that receives the MWL and one of the segment select lines and drives the LWL when the MWL and segment select line are both asserted.

To utilize the DRAM with sub-channels 100, a memory controller provides not just a row address with an activate command, but also the information about which segment should be activated in the form of a segment select mask. In one embodiment, the segment select mask includes one bit for each sub-channel 170, thereby allowing fine-grained activates. One or more bits in the segment select mask may be enabled simultaneously, allowing activation of multiple segments within a row simultaneously. Thus not only can different non-contiguous segments of a row be activated, the entire row can be activated, just as in a conventional DRAM. The segment select lines may be encoded using 3 bits to represent 8 different combinations instead of as a mask with a bit-per-segment.

In one embodiment, a set of segment select lines is dedicated to every group of two consecutive subarrays 180, and activation of a different row in different sub-channels 170 is supported, as long as the sub-channels 170 are not in the same subarray group. Implementing dedicated row address logic 115 with segment select storage 205 and MWL storage 215 for each subarray 180 enables simultaneous processing of accesses to different rows in different sub-channels 170 within the same bank 120. Driving of the MWL is decoupled from the output of the global row decoder logic 105 using the segment select storage 205 and MWL storage 215, which each store the subarray row enabling information for a corresponding subarray 180. In some embodiments, the subarray row address logic 115 is omitted, limiting a bank 120 to a single open row; simultaneous access to rows open in different banks in different sub-channels remains possible, however. In some embodiments, the subarray row address logic 115 is replicated for each subchannel 170 within a subarray 180, allowing different rows in different sub-channels 170 to be activated within the same subarray 180.

Parallel Sub-Channels

Each sub-channel 170 resembles an independent narrow channel. If a 256 B row is activated in a sub-channel 170, another row can be activated in parallel in the same bank 120, but in a different sub-channel 170, as each sub-channel 170 has a dedicated I/O buffer 160 within the I/O buffer slice 125 that is not shared with another sub-channel 170. Similarly, in one embodiment, each storage unit 155 includes a row-buffer segment 135 that is not shared with another storage unit 155. As the datapath (e.g., R/W bus 165-0, 165-1, etc.) is also partitioned, different sub-channels 170 in a bank 120 can also simultaneously process reads and/or writes to different DRAM atoms. However, while the existing hierarchical structure of a DRAM readily lends itself to parallel operation of the I/O buffers 160, row-buffer segments 125, and datapaths, there is only one global row decoder logic 105 and one column decoder 175 in each bank 120 and the global row decoder logic 105 and the column decoder 175 are shared by all the sub-channels 170 in the bank 120. Without the inclusion of additional logic (e.g., address decoupling registers, such as the row address storage 215 and the CA storage 150), the shared global row decoder logic 105 and one column decoder 175 prevent parallel activates to different rows, and reads/write from different columns in different sub-channels 170. An advantage of maintaining the shared global row decoder logic 105 and one column decoder 175 is that the die area is not increased.

After the row-address is latched in the row address storage 215, the global row decoder logic 105 is free to accept another row-address, and drive a MWL in a different subarray 180 using the row address storage 215 in the different sub-array 180 while the previous row-activation is in progress. Similarly, the column-decoding logic is decoupled from driving the column select line (CSL) using the column address storage 150. Consequently, the number of simultaneous reads or writes that can occur in a bank 120 is limited to the number of sub-channels 170, with each sub-channel 170 potentially accessing a different column of data.

After a row is activated and the bits are read into the row-buffer segment 135, a column command triggers the column selector 140 to select a portion of the data latched in the row-buffer segment 135 based on column select lines to generate the column data. In a conventional DRAM, each storage unit in a subarray receives the same column address (or set of column select lines generated by decoding the shared column address). In contrast, in the DRAM with sub-channels 170, a dedicated column address is stored in the column address storage 150 for each sub-channel 170 within a bank 120 so that a different column may be accessed in each sub-channel 170. Implementing a set of per-sub-channel 170 column-select storages 150 circumvents the inability to simultaneously process accesses to different sub-channels 170.

Figure 2D:
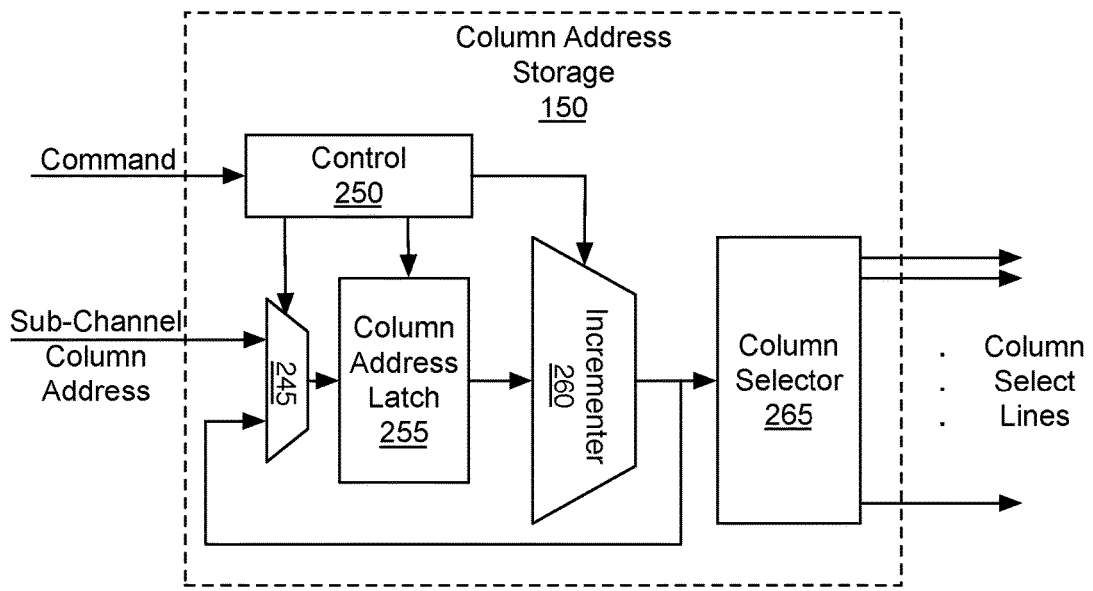
FIG. 2D illustrates a block diagram of the column storage logic shown in FIG. 1B, in accordance with one embodiment.

FIG. 2D illustrates a block diagram of the column address storage 150 shown in FIG. 1B, in accordance with one embodiment. The column address storage 150 includes a control 250, column address latch 255, a multiplexor 245, an incrementer 260, and a column selector 265. The column address latch 255 may be implemented as latches, registers, or other suitable storage circuits. The column address latch 255 allows the column decoder 175 to assert different column select lines in different sub-channels 170 in successive cycles to enable parallel reads/writes from across the sub-channels 170.

In a conventional HBM architecture, the whole DRAM atom is fetched from the row-buffer into the I/O buffer in a single internal cycle. For example, a 32 B DRAM atom is interleaved across the row that is read out in one internal DRAM cycle. However, with multiple sub-channels 170, the same transfer takes multiple internal cycles due to the narrow datapath. In the DRAM with sub-channels 100, a DRAM atom is interleaved across only the storage units 155 that are activated in unison, so that the DRAM atom can be retrieved in its entirety from these storage units 155 alone. Assuming N=8 sub-channels 170, reading the DRAM atom from $\frac{1}{8}^{th}$ of the storage units 155 in one cycle would require increasing the output width of each storage unit 155 from 8 bits to 64 bits. However, increasing the datapath width by 8× increases the wiring tracks in the M2 and M3 layers, thereby increasing the height and width of the storage unit 155 and proportionally increasing the area of the global SAs 145 needed in the periphery. The area increase is prohibitively high for high bandwidth storage unit 155. Therefore, the per-storage unit 155 bandwidth is unaltered and instead, each DRAM atom is transferred from the row buffer segment 135 to the global SAs 145 and onward to the I/O buffer slice 125 over several cycles instead of one internal DRAM cycle. From the point of view of a DRAM transfer, the data appears to be stored and fetched from a channel which is $\frac{1}{8}^{th}$ the bandwidth compared with a conventional DRAM row-buffer with proportionally fewer storage units 155 and datapath resources (e.g., global sense amplifiers and I/Os).

For example, when 8 sub-channels 170 are implemented, transferring a DRAM atom between the row buffer segment 135 and the I/O buffer slice 125 requires 8 internal cycles. For a single burst access, CSLs should be asserted sequentially in a sub-channel 170. To generate the sequence of CSLs, the column address storage 150 increments the column address that was sent with the CAS command by the column decoder 175 using an incrementer 260. The incremented column address is output from the incrementer 260 to a column selector 265 that decodes the incremented address to generate the column select lines. In one embodiment, the incrementer 260 is a small 3-bit ripple carry adder. Incrementing the column address within the column address storage 150 avoids extra traffic on the external column-address bus. The multiplexer 245 is controlled by the control 250 to select either the sub-channel column address or the incremented address for input to the column address latch 255. The control 250 also controls whether the incrementer 260 increments the sub-channel column address or passes the sub-channel column address through to the column selector 265 unchanged.

As previously explained in conjunction with FIG. 2D, the sub-channel column address stored in each sub-channel 170 is incremented (or shifted when the column address is stored in a decoded form) over N internal cycles to step through portions of the row within a sub-channel 170, where N is the number of sub-channels 170. Crucially, the internal burst access support allows each sub-channel 170 to use only a part of the I/O buffer resources, so that each sub-channel accesses a dedicated I/O buffer 160, enabling parallel operation of the sub-channels 170. Thus, different sections of different rows can be activated in parallel, improving DRAM bandwidth utilization in applications with low-locality.

Figure 3D:
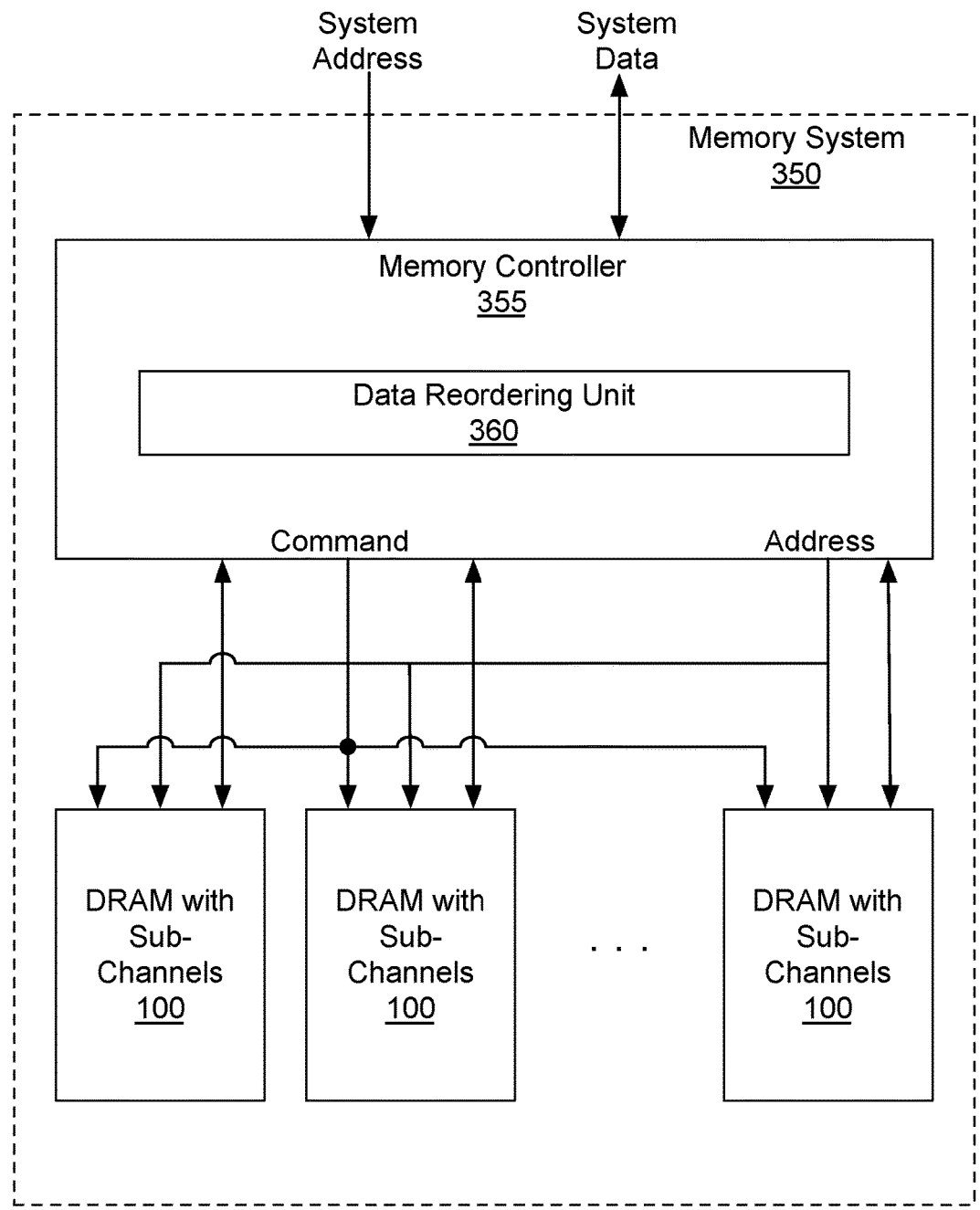
FIG. 3D is a block diagram of a memory system including the DRAM with sub-channels shown in FIG. 1A, in accordance with one embodiment.

FIG. 3A illustrates a first portion of a table detailing per-cycle operations for one bank 120 of the DRAM with sub-channels 100 shown in FIG. 1A, in accordance with one embodiment. Inputs to the DRAM with sub-channels 100 include the row command, row address, row segment select mask, column command, column address, and column sub-channel mask (e.g., column select lines). The inputs are typically generated by a memory controller. The following timing parameters are modeled in the table: tRCD=5 (Activate→Read/Write delay); tCL=2 (Read command to Data-out latency); tWL=2 (Write command to data in latency); tRP=3 (precharge→activate delay); tRTW=10 (read→write delay); tCCD=8 (read→read or write→write delay); tWTR=10 (write→read delay). The activate command at cycle 0 is a command that was coalesced by a memory controller. Coalescing is described in conjunction with FIG. 3D. The read commands in cycles 5 and 17, the write command in cycle 29, and the precharge command in cycle 36 are also coalesced commands.

FIG. 3B illustrates a second portion of a table detailing per-cycle operations for one bank 120 of the DRAM with sub-channels 100 shown in FIG. 1A, in accordance with one embodiment. The operations performed in a first 4 of 8 different sub-channels 170 of the DRAM with sub-channels 100 is shown in separate columns for each cycle. In the DRAM with sub-channels 100, when 8 sub-channels are implemented, 8 internal cycles are needed to completely transfer the 32 B atom because only 1 B (8 bits) is accessed from each storage unit 155 per internal cycle and the 32 B atom is spread across the different sub-channels. As previously explained, the internal and external burst is pipelined. Thus, the first beat of the data appears on the external I/O when the access latency time, tCAS, has elapsed after the column-read command, the same as in a conventional DRAM. However, the burst takes 8 DDR cycles instead of 1 DDR cycle.

FIG. 3C illustrates a third portion of a table detailing per-cycle operations for one bank 120 of the DRAM with sub-channels 100 shown in FIG. 1A, in accordance with one embodiment. The operations performed in a second 4 of 8 different sub-channels 170 of the DRAM with sub-channels 100 is shown in separate columns for each cycle. Notice that over the first 8 cycles each one of the sub-channels 170 is activated followed by a burst read of data from the respective sub-channel 170 over 8 cycles and that the columns that are read are not the same for all of the sub-channels 170. While the read operation is in progress for 7 of the sub-channels 170, a write operation is performed for the sub-channel 5.

Creating parallel sub-channels 170 may not only recover the performance loss from narrower channels, it may also improve the performance of many memory intensive workloads. Most GPU workloads are latency insensitive and are bottlenecked by the delivered bandwidth of the memory system. In memory-intensive applications with low spatial locality, the delivered bandwidth can be low when the bank-level parallelism (BLP) is not sufficient to cover for the tRC delay of precharging a bank and activating a row. Even if there is high BLP, if the accesses-per-activate is very low, the bandwidth utilization is restricted by the activate-rate limits posed by current delivery constraints (tFAW and tRRD).

The DRAM with sub-channels 100 with parallel operation across sub-channels 170 alleviates both of these problems. First, due to more parallel sub-channels 170, effectively there are more banks in the system. Therefore, it is possible to overlap row-activations to different rows of the same original bank. Second, due to the small activation granularity, each activate places a lower burden (approximately ⅛th the baseline) on the charge pumps that supply the voltage to the master word line. Thus in the same tFAW period, the DRAM with sub-channels 100 can perform 32 activate operations while a DRAM without sub-channels can only perform 4 activate operations. Therefore, the DRAM with sub-channels 100 can accelerate activate-rate limited applications like the ones that exhibit data dependent irregular accesses. Even though the empty-pipe (unloaded) latency experienced by a DRAM request is 7 ns higher with 8 sub-channels 170 compared with a conventional DRAM, the overall performance is improved by increasing the effective throughput of the DRAM system.

Reduced Datapath Width Sub-Channels

Due to pipelining of burst accesses, each sub-channel 170 only needs 1/Nth the capacity of the I/O buffer and the I/O pins. Thus the datapaths of the N sub-channels 170 are completely independent. However, the reduced datapath width may also result in higher switching activity on the internal R/W busses 165 and external data buses during a DRAM atom transfer, causing higher column and I/O energy. The performance degradation when only one sub-channel 170 is active can be mitigated if all 8 sub-channels 170 are operated in parallel. In one embodiment, a memory controller implements functionality to improve parallel operation of the DRAM memory controller architecture to achieve this functionality.

FIG. 3D is a block diagram of a memory system 350 including the DRAM with sub-channels 100 shown in FIG. 1A, in accordance with one embodiment. The memory system 350 includes a memory controller 355 and one or more DRAM with sub-channels 100. The column and row sub-channel masks may be included with the column address and the row address, respectively.

The row address storage 215 in the row address logic 115, the column address latch 255 in the column address storage 150, and the partitioned datapath allow issuing of overlapping commands to the same bank 120 in different sub-channels 170. However all sub-channels 170 in a channel share the address/command bus between the memory controller 355 and the DRAM with sub-channels 100. Also, the same bank 120 in different sub-channels 170 shares the global row decoder logic 105 and the column decoder 175 of the physical bank 120. The memory controller 355 may be configured to implement a memory-controller optimization called command coalescing, that can alleviate the contention for the shared global row decoder logic 105 and the column decoder 175 to improve performance of the sub-channels 170.

To coalesce activation commands, the memory controller 350 scans command queues to find activate commands directed to the same row in different sub-channels 170, and issues a single activate command for all of the corresponding requests. The sub-channel mask segment select line mask sent with the activate command is set appropriately such that the needed sub-channels 170 are enabled. Activate coalescing thus allows sub-channels 170 to mimic the performance of a conventional DRAM when there is high access locality.

Similarly, the memory controller 350 may also perform read coalescing and write coalescing, issuing a single RD (or WR) command to multiple sub-channels 170 if the same column and bank is accessed in each one of the multiple sub-channels 170. In one embodiment, when command coalescing is enabled, an arbiter in the memory controller 350 can merge several ready commands from different sub-channels 160 into one command if the commands are to the same row (activate) and bank or the same column and bank (read/write). The subarray column address output by the column decoder 175 is used along with the supplied column sub-channel mask to drive the desired CSLs in each of the selected sub-channels 170 (via the column address storages 150). Thus the reads can progress completely in parallel across sub-channels 170. Compared to the 64 columns in the original row, a 8-subchannel system will have only 8 columns per subrow, increasing the probability of finding such coalescing opportunities.

Additionally, a data reordering unit 360 within the memory controller 355 is configured to map a DRAM atom such that the DRAM atom is contained entirely within a single activated subset of a row (instead of being dispersed over the entire row). Crucially, to maintain density, the DRAM atom is read out from the activated region of the row using only the fraction of the total bank datapath that is available in the activated region.

Figure 3E:
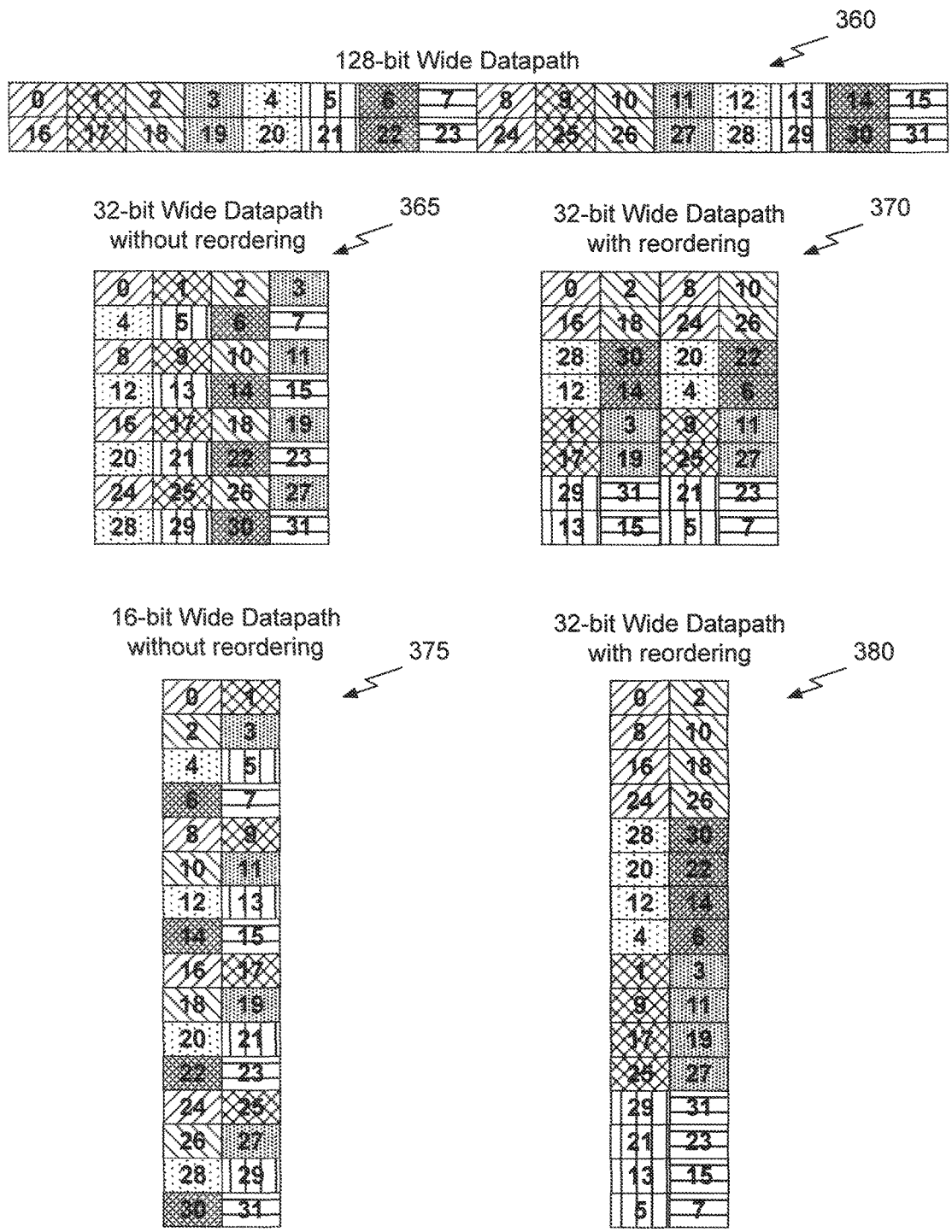
FIG. 3E is a conceptual diagram illustrating data reordering patterns for the DRAM with sub-channels shown in FIG. 1A, in accordance with one embodiment.

FIG. 3E is a conceptual diagram illustrating data reordering patterns for the DRAM with sub-channels 100 shown in FIG. 1A, in accordance with one embodiment. FIG. 3E shows how a given 32-byte DRAM atom is transferred over datapaths of different widths. In a conventional memory, the 32 B DRAM atom initially moves across a 256-bit internal bus. All switching activity on the 256-bit internal bus is due to switching between successive DRAM atoms. As the data moves to the DDR I/Os, the datapath narrows, and pattern 360 shows a straightforward mapping of how data is serialized onto the narrower 128-bit interface. As seen, the different corresponding bytes of 4-byte (or 8-byte) words line up, leading to relatively modest switching activity within the transfer of a DRAM atom; though there is still significant potential for switching activity between successive atoms. Often a 32 B atom consists of eight 32-bit values or four 64-bit values for which the corresponding bytes of adjacent words are strongly correlated. A design with 8 sub-channels 170 may increase the column-energy compared with a conventional DRAM if the data ordering is not considered.

With 8 sub-channels 170, the internal 256-bit wide datapath is initially partitioned into 8 slices that are each 32-bits wide. The data transfer using the straightforward conventional ordering on the 32-bit internal datapath is shown in pattern 365. Since adjacent 4-byte data words tend to be more highly correlated than words 16-bytes away, the internal switching rate tends to decrease for benchmarks dominated by 32-bit datatypes. As the data moves to the I/O bus, the datapath narrows to 16-bits and the frequency doubles. The internal switching rate increases for the narrower 16-bit wide bus as seen by the pattern 375.

To reduce switching activity, the data reordering unit 360 in the memory controller 355 may be configured to remap the data within a burst as it is written/read from the DRAM with sub-channels 100 in a manner designed to cause highly correlated bits to be transmitted on the same wires in successive cycles. Based on the fact that commonly 32-bit and 64-bit data values from an array are sent within a DRAM atom, a simple static ordering, shown in patterns 370 and 380 may be applied to all DRAM atoms. Offsets of 8 bytes (well suited to double-precision values) are favored in successive cycles, then the remaining bytes are transferred at a 4-byte offset. The net result is that data with highly correlated 8-byte or 4-byte values tend to have reduced switching activity. Since there is more toggling energy spent in the narrow 16-bit interface and I/Os, the mapping may be optimized for transfers across a 16-bit bus as shown in the pattern 380.

The data ordering pattern 370 or 380 may be statically applied by the data reordering unit 360 within the memory controller 355 to every DRAM atom when the DRAM atom is being stored in the DRAM with sub-channels 100 and the reordering requires no additional hardware or meta-data storage. During a store operation to the DRAM with sub-channels 100, the data to be transmitted is loaded into the transmit buffer in the memory controller 355 in the order specified by the pattern 380 and then sent to the DRAM with sub-channels 100. On a read, the data is returned from the DRAM with sub-channels 100 in the toggle-efficient order and reordered by the data reordering unit 360 within the memory controller 355 to form the original ordering. The reordering scheme may be built into the wiring connections in the transmit and receive buffers within the buffers in the memory controller 355 so that no active circuitry is needed to implement the reordering.

Figure 4:
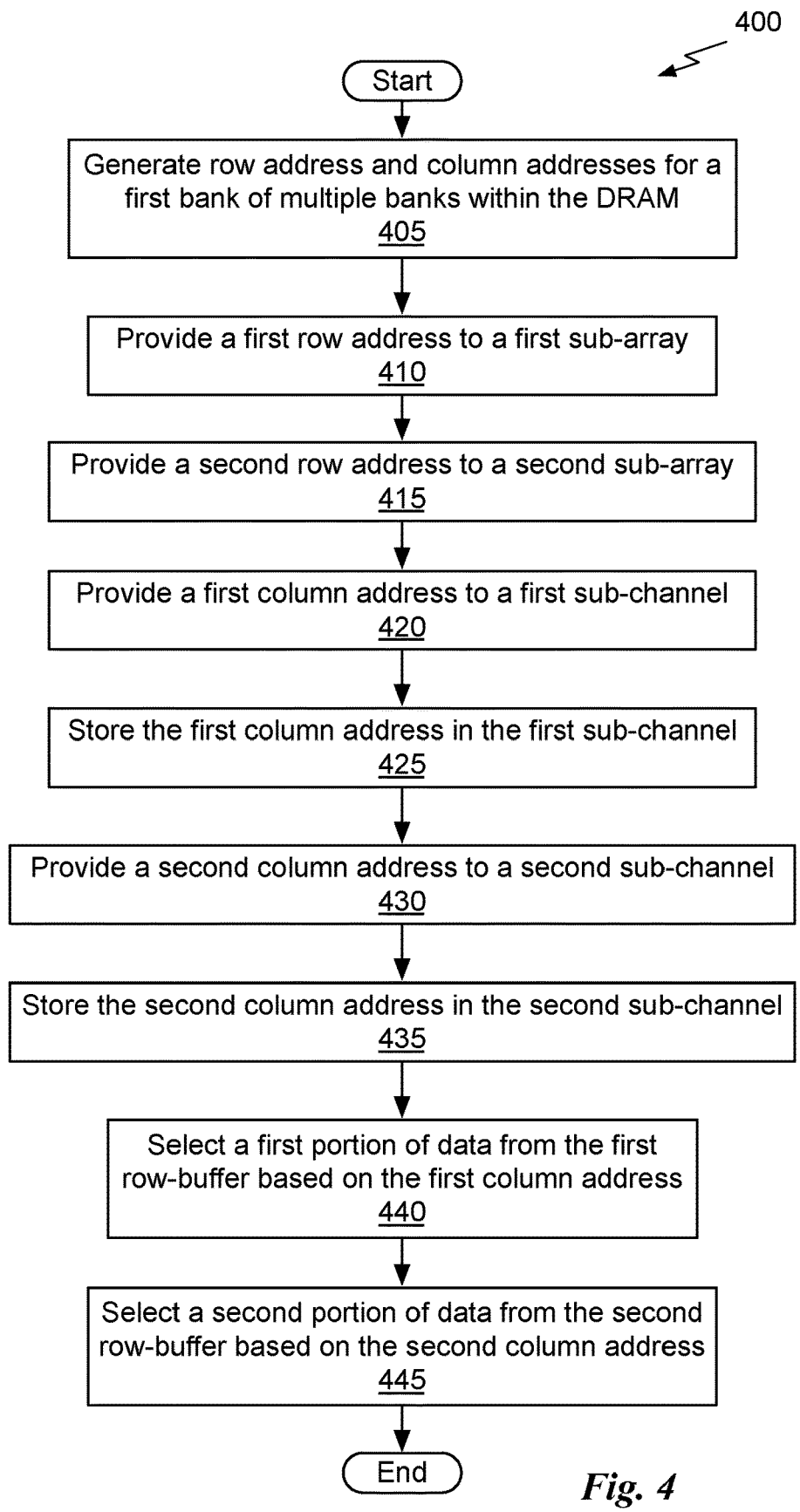
FIG. 4 a flowchart of a method for accessing the DRAM with sub-channels shown in FIG. 1A, in accordance with one embodiment.

FIG. 4 is a flowchart of a method for accessing the DRAM with sub-channels 100 shown in FIG. 1A, in accordance with one embodiment. Although method 400 is described in the context of the DRAM with sub-channels 100, the method 400 may also be performed by a program, custom circuitry, or by a combination of custom circuitry and a program. Furthermore, persons of ordinary skill in the art will understand that any system that performs method 400 is within the scope and spirit of embodiments of the present invention.

At step 405, the global row decoder logic 105 and the column decoder 175 generate row addresses and column addresses for a first bank 120 of multiple banks 120 within the DRAM with sub-channels 100. At step 410, the global row decoder logic 105 provides a first row address to a first sub-array 180-A comprising the first storage units 155-0A through 155-3A and the second storage units 155-3A through 155-7A. At step 415, the global row decoder logic 105 provides a second row address to a second sub-array 180-B comprising the third storage units 155-0B through 155-3B and the fourth storage units 155-4B through 155-7B. Activate commands are issued to activate the rows associated with the first row address and the second row address. Some delay (e.g., tRCD) after the activate command is received, the data is in the row buffer and the data can be accessed using read/write commands with a column address.

At step 420, the CA storage 150-0 provides a first column address to a first sub-channel 170-0, the first sub-channel 170-0 comprising the first storage units 155-0A through 155-3A coupled to a first row-buffer (e.g., the row buffer segments 135) and the third storage units 155-0B through 155-3B. At step 425, the CA storage 150-0 stores the first column address in the first sub-channel 170-0.

At step 430, the CA storage 150-1 provides a second column address to a second sub-channel 170-1, the second sub-channel 170-1 comprising the second storage units 155-4A through 155-7A and the fourth storage units 155-4B through 155-7B coupled to a second row-buffer. At step 435, the CA storage 150-1 stores the second column address in the second sub-channel 170-1.

At step 440, the column selector 140 selects, based on the first column address, a first portion of data from the first row-buffer for output to a data bus (e.g., R/W bus 165-0). At step 445, the column selector 140 selects, based on the second column address, a second portion of data from the second row-buffer for output to a data bus (e.g., R/W bus 165-1).

Partitioning each Bank 120 into independent sub-channels 170 enables a reduction in DRAM row-energy due to row overfetch by using virtually smaller rows. Memory bandwidth is maintained by activating different row-segments in parallel and providing internal burst accesses. The CA storage 150 increments the column address within each sub-channel 170 to access atoms over multiple cycles (beats), so that a different portion of each atom is access each beat to implement the internal burst access feature. The CA storage 150 stores the sub-channel column address for each sub-channel 170. A segment select mask is supported where two or more bits can be set to separately enable segments of the MWL, so that two or more sub-columns 170 can be accessed simultaneously.

Applications with high-locality may be supported by using a single activate command to open the same rows across multiple sub-channels 170. Importantly, read and write commands can be issued simultaneously to the same column address in different sub-channels 170. Finally, the DRAM with sub-channels 100 provides a circuit organization that is compatible with current DRAM manufacturing and integration processes and is especially suited for throughput memory controllers and systems.

Throughput oriented processors, such as GPUs, have a history of using specialized DRAMs optimized for bandwidth. As stacked, on-package DRAM technologies enable increasing bandwidth, the intrinsic DRAM array access energy is becoming significant. This row energy is particularly problematic in workloads that exhibit poor row locality, requiring frequent bank activates and precharges. The growing emergence of these low-locality workloads, coupled with a high degree of DRAM bank contention due to increasing parallelism in the processor, further motivate the need for a DRAM architecture having high internal parallelism and a small effective row size.

The proposed subchannel architecture creates smaller effective rows via master-wordline segmentation, while simultaneously providing additional internal parallelism by forming a number of semi-independent sub-channels 170. The smaller row size and a well-crafted data layout pattern, may result in a 35% energy improvement over conventional DRAMs. The additional internal parallelism in the DRAM sub-channel 100 architecture, along with the command coalescing optimizations, may provide a 13% performance improvement.

Figure 5:
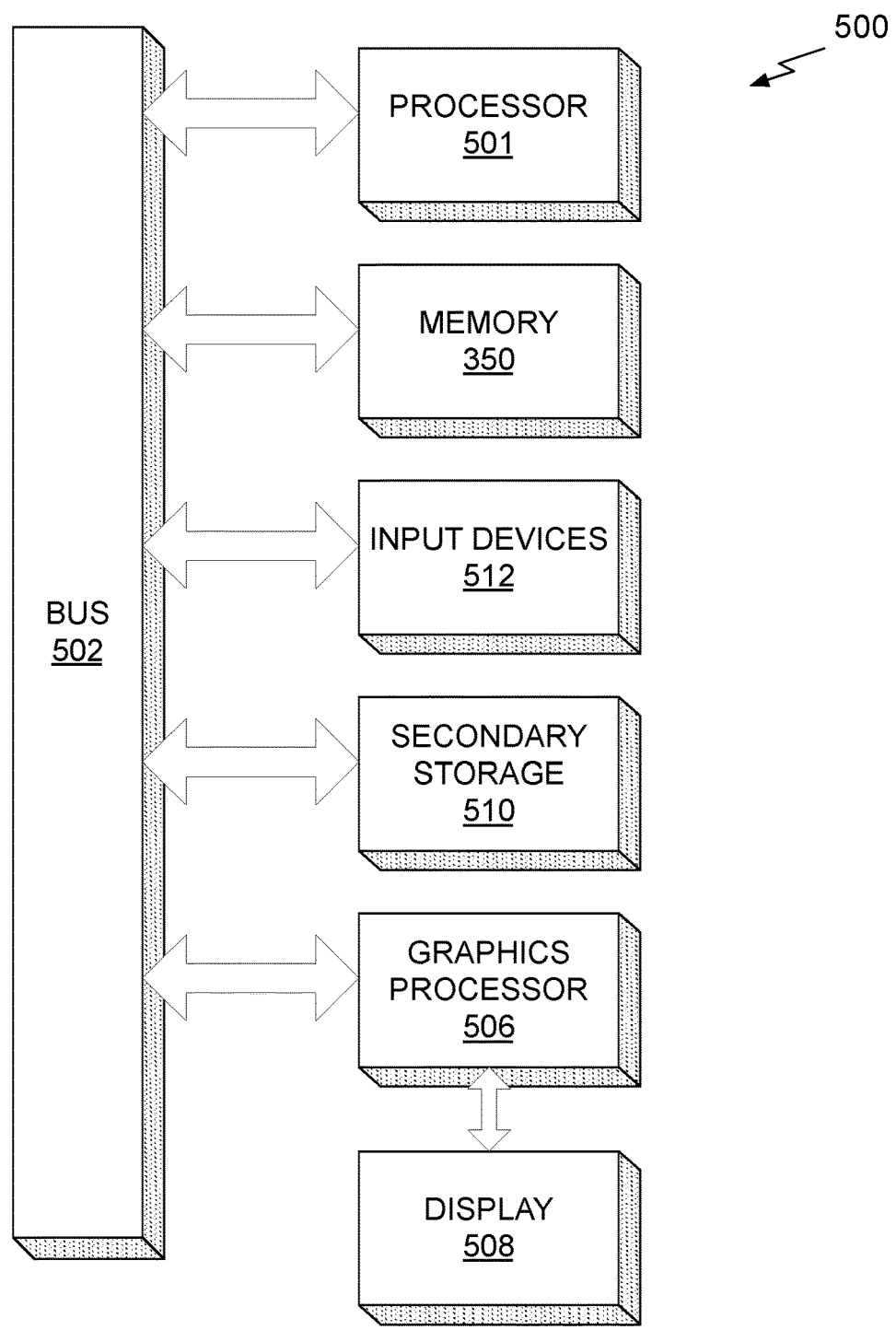
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes the memory system 350. Control logic (software) and data may be stored in the memory system 350.

The system 500 also includes a processor 501 (e.g., CPU), input devices 512, a graphics processor 506, and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional CPU and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, input data for the processor 501, output data generated by the processor 501, and the like may be stored in the memory system 350 and/or the secondary storage 510. Such computer programs, when executed, enable the system 500 to perform various functions. The memory system 350, the storage 510, and/or any other storage are possible examples of computer-readable media. One or more of the memory 504 or secondary storage 510 may include at least one DRAM with sub-channels 100.

In one embodiment, the architecture and/or functionality of the various previous figures may be implemented in the context of the memory system 350, processor 501, the graphics processor 506, an integrated circuit (not shown) that is capable of at least a portion of the capabilities of one or more of the memory system 350, the processor 501, and the graphics processor 506, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game console, embedded system, and/or any other type of logic. Still yet, the system 500 may take the form of various other devices including, but not limited to a personal digital assistant (PDA) device, a mobile phone device, a television, etc.

Further, while not shown, the system 500 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A dynamic random access memory (DRAM), comprising:
control logic for generating row addresses and column addresses, wherein the control logic provides a first row address to a first sub-array and a second row address to a second sub-array; and
a first bank that is coupled to the control logic, the first bank comprising:
the first sub-array including a first storage unit coupled to a first row-buffer in a first sub-channel and a second storage unit in a second sub-channel, wherein the first sub-array receives the first row address, and wherein a first column address is stored in the first sub-channel and used to select a first portion of data from the first row-buffer for output to a data bus; and the second sub-array including a third storage unit in the first sub-channel and a fourth storage unit coupled to a second row-buffer in the second sub-channel, wherein the second sub-array receives the second row address, and wherein a second column address is stored in the second sub-channel and used to select a second portion of data from the second row-buffer for output to the data bus.

2. The DRAM of claim 1, wherein the first portion and the second portion are output to the data bus simultaneously.

3. The DRAM of claim 1, further comprising:
first segment select signals configured to individually enable the first sub-channel and the second sub-channel in at least one of the first storage unit and the second storage unit; and
second segment select signals configured to individually enable the first sub-channel and the second sub-channel in at least one of the third storage unit and the fourth storage unit.

4. The DRAM of claim 3, wherein the first segment select signals enable a first portion of a first row in the first storage unit and disable a second portion of the first row in the second storage unit.

5. The DRAM of claim 4, wherein the first segment select signals also enable a third portion of the first row in a fifth storage unit in a third sub-channel.

6. The DRAM of claim 1, wherein the second storage unit is coupled to a third row-buffer in the second sub-channel, and wherein the second column address that is stored in the second sub-channel is used to select a third portion of data from the third row-buffer for output to the data bus simultaneously with the first portion of data.

7. The DRAM of claim 1, wherein the first column address is different than the second column address.

8. The DRAM of claim 1, wherein bytes of input data are reordered before the input data is output to the data bus for a write operation.

9. The DRAM of claim 1, wherein bytes of data received from the data bus are reordered before the data is output for a read operation.

10. The DRAM of claim 1, wherein the first column address that is stored in the first sub-channel is incremented each cycle to select different portions of the first row-buffer for output to the data bus.

11. A system, comprising:
a memory controller; and
a dynamic random access memory (DRAM) coupled to the memory controller, the DRAM comprising:
control logic for generating row addresses and column addresses, wherein the control logic provides a first row address to a first subarray and a second row address to a second subarray;
a first bank that is coupled to the control logic, the first bank comprising:
the first subarray including a first storage unit coupled to a first row-buffer in a first sub-channel and a second storage unit in a second sub-channel, wherein the first subarray receives the first row address and a first column address is stored in the first sub-channel and used to select a first portion of data from the first row-buffer for output to a data bus, and
the second subarray including a third storage unit in the first sub-channel and a fourth storage unit coupled to a second row-buffer in the second sub-channel, wherein the second subarray receives the second row address and a second column address is stored in the second sub-channel and used to select a second portion of data from the second row-buffer for output to the data bus; and
a second bank that is coupled to the control logic.

12. The system of claim 11, wherein the first portion and the second portion are output to the data bus simultaneously.

13. The system of claim 11, further comprising:
first segment select signals configured to individually enable the first sub-channel and the second sub-channel in at least one of the first storage unit and the second storage unit; and
second segment select signals configured to individually enable the first sub-channel and the second sub-channel in at least one of the third storage unit and the fourth storage unit.

14. The system of claim 11, wherein the memory controller is configured to reorder bytes of input data before outputting the input data to the data bus for a write operation.

15. The system of claim 11, wherein the memory controller is configured to reorder bytes of data received from the data bus before outputting the data for a read operation.

16. A method for accessing a dynamic random access memory (DRAM), comprising:
generating row addresses and column addresses for a first bank of multiple banks within the DRAM;
providing a first row address to a first sub-array comprising a first storage unit and a second storage unit;
providing a second row address to a second sub-array comprising a third storage unit and a fourth storage unit;
providing a first column address to a first sub-channel, the first sub-channel comprising the first storage unit coupled to a first row-buffer and the third storage unit;
storing the first column address in the first sub-channel;
providing a second column address to a second sub-channel, the second sub-channel comprising the second storage unit and the fourth storage unit coupled to a second row-buffer;
storing the second column address in the second sub-channel;
selecting, based on the first column address, a first portion of data from the first row-buffer for output to a data bus; and
selecting, based on the second column address, a second portion of data from the second row-buffer for output to the data bus.

17. The method of claim 16, wherein the first portion and the second portion are output to the data bus simultaneously.

18. The method of claim 16, further comprising enabling a first portion of a first row in the first storage unit and disabling a second portion of the first row in the second storage unit.

19. The method of claim 16, wherein the first column address is different than the second column address.

20. A dynamic random access memory (DRAM), comprising:
control logic for generating row addresses and column addresses; and
a first bank that is coupled to the control logic, the first bank comprising:
a first sub-array including a first storage unit coupled to a first row-buffer in a first sub-channel and a second storage unit in a second sub-channel, wherein the first sub-array receives a first row address and a first column address is stored in the first sub-channel and used to select a first portion of data from the first row-buffer for output to a data bus, the second storage unit is coupled to a third row-buffer in the second sub-channel and the second column address that is stored in the second sub-channel is used to select a third portion of data from the third row-buffer for output to the data bus simultaneously with the first portion of data, and the first portion of data and the third portion of data are accessed using the first row address; and a second sub-array including a third storage unit in the first sub-channel and a fourth storage unit coupled to a second row-buffer in the second sub-channel, wherein the second sub-array receives a second row address and a second column address is stored in the second sub-channel and used to select a second portion of data from the second row-buffer for output to the data bus.

* * * * *

UNITED STATES PATENT AND TRADEMARK OFFICE
CERTIFICATE OF CORRECTION

PATENT NO. : 10,468,093 B2  
APPLICATION NO. : 15/448416  
DATED : November 5, 2019  
INVENTOR(S) : Niladrish Chatterjee et al.

It is certified that error appears in the above-identified patent and that said Letters Patent is hereby corrected as shown below:

In the Specification

Column 1 Line 12 Please add the following paragraph after the Claim of Priority paragraph:
-- STATEMENT REGARDING FEDERALLY SPONSORED RESEARCH AND DEVELOPMENT
This invention was made with US Government support under LLNS subcontract B609911 awarded by DOE, and under Agreement HR0011-13-3-0001 awarded by DARPA. The US Government has certain rights in this invention. --

Signed and Sealed this
Fourteenth Day of July, 2020

Andrei Iancu
*Director of the United States Patent and Trademark Office*